United States Patent [19]
Gingell

[11] 4,109,110
[45] Aug. 22, 1978

[54] DIGITAL-TO-ANALOG CONVERTER

[75] Inventor: Michael John Gingell, Sawbridgeworth, England

[73] Assignee: International Standard Electric Corporation, New York, N.Y.

[21] Appl. No.: 796,919

[22] Filed: May 16, 1977

Related U.S. Application Data

[63] Continuation of Ser. No. 642,876, Dec. 22, 1975, abandoned.

[30] Foreign Application Priority Data

Feb. 20, 1975 [GB] United Kingdom ............... 07157/75

[51] Int. Cl.² ...................... H04J 15/00; H03K 13/24
[52] U.S. Cl. .............................. 179/15 AP; 325/38 B; 340/347 DD

[58] Field of Search ... 340/347 M, 347 DA, 347 DD; 325/38 R, 38 B; 332/1 D; 179/15 AV, 15 AP

[56] References Cited

U.S. PATENT DOCUMENTS

| | | | |
|---|---|---|---|
| 2,907,021 | 9/1959 | Woods | 340/347 DA |
| 2,916,209 | 12/1959 | Adamson et al. | 340/347 DA |
| 3,831,167 | 8/1974 | Tewksbury | 340/347 DA |
| 3,916,107 | 10/1975 | McDonald | 325/38 B |
| 4,044,306 | 8/1977 | Villeret et al. | 179/15 AP X |

Primary Examiner—Thomas J. Sloyan
Attorney, Agent, or Firm—John T. O'Halloran; Jeffrey P. Morris

[57] ABSTRACT

The sample rate of the digital input is increased to a point where by reducing the number of bits per sample the final digital-to-analog conversion can be accomplished in a rate multiplier.

11 Claims, 11 Drawing Figures

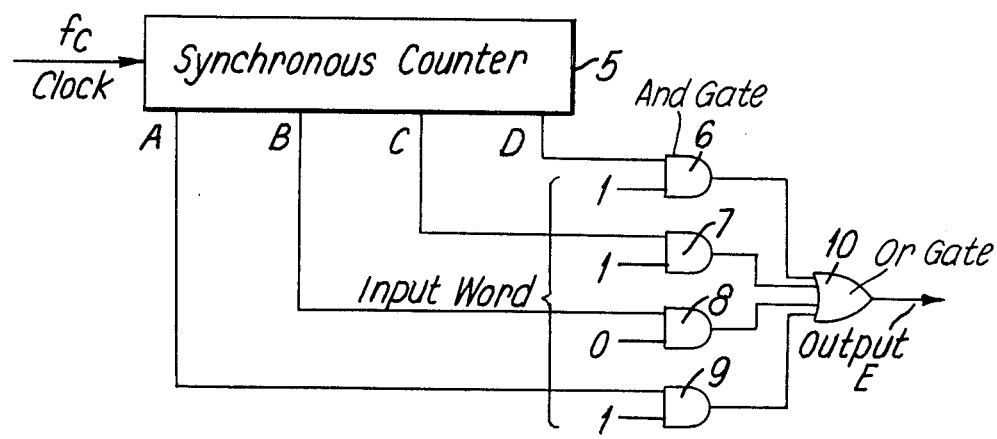
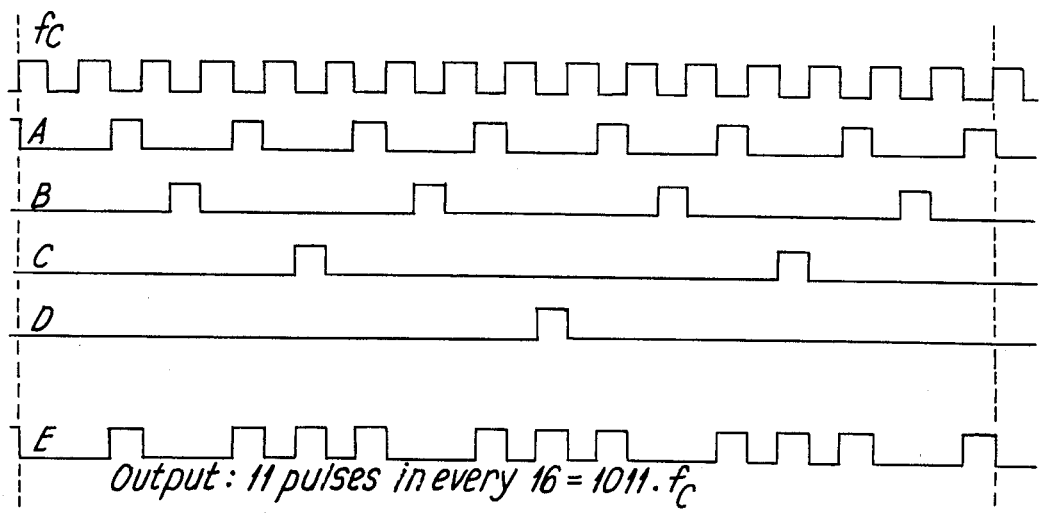
Output: 11 pulses in every 16 = 1011.$f_C$
Fig. 2.

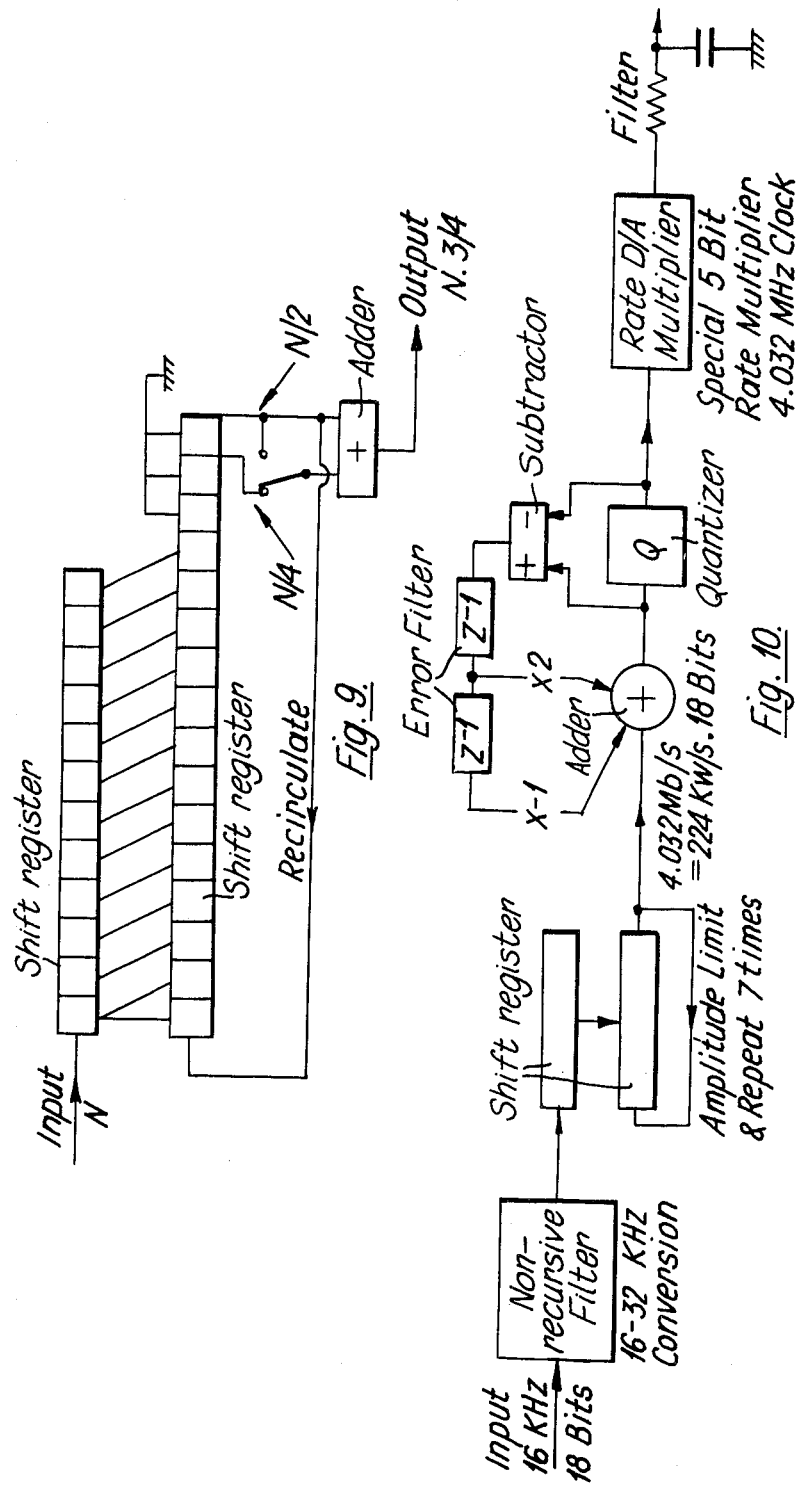

DIGITAL-TO-ANALOG CONVERTER

This is a continuation, of application Ser. No. 642,876, filed Dec. 22, 1975, now abandoned.

BACKGROUND OF THE INVENTION

This invention relates to digital-to-analog (D/A) converters such as are used in pulse code modulation systems of communication.

The function of the ideal D/A converter is to operate on a digital number and convert it to a voltage or current proportional to the number. In communication systems the digital numbers represent points taken at regular sampling intervals from a continuous waveform. The ideal converter should in this case produce a continuous analog output which is the result of drawing a smooth curve through the sample points and which contains no component above half sampling frequency. In practice this is usually achieved using a precision switched resistor ladder network which holds each sample constant for one sample period and then suppressing unwanted components in the output spectrum by means of a low pass filter. Ladder networks are expensive and cannot easily be integrated with the degree of precision required in communication systems.

An alternative that is more amenable to digital integration uses a rate multiplier. This is a simple logical device producing an output pulse stream whose mean density is proportional to a clock frequency times the input number. Since the input number is changed at each sample instant the clock frequency must be equal to the sampling frequency times the number of possible levels in the input number. For example a 12 bit linear PCM at 8kHz (kilohertz) sampling rate would require a clock frequency of 32.768MHz (megahertz). A compromise converts the PCM words to sign, magnitude and scaling components. The magnitude is applied to a rate multiplier running at a more modest clock frequency the output of which is scaled and signed by analog means.

SUMMARY OF THE INVENTION

An object of the present invention is to provide an improved D/A converter.

A feature of the present invention is the provision of a digital-to-analog converter for a pulse code modulated (PCM) signal having a plurality of code groups and a given sampling rate comprising: a source of the PCM signal; first means coupled to the output of the source for increasing the given sampling rate; second means coupled to the output of the first means for selecting a predetermined number of the most significant bits of each of the code groups of the increased sampling rate PCM signal; and third means coupled to the output of the second means for converting the most significant bits into a pulse stream having a mean density which is proportional to an analog signal represented by the plurality of code groups.

The object of the converter according to the present invention is to increase the sampling rate of the signal to a point where, by reducing the number of bits per sample, only a minimal digital-to-analog converter is required. This may require only 3 or 4 bits and can then be implemented using a rate multiplier to produce an output pulse stream the mean density of which is proportional to analog signal amplitude.

BRIEF DESCRIPTION OF THE DRAWING

Above-mentioned and other features and objects of this invention will become more apparent by reference to the following description taken in conjunction with the accompanying drawing, in which:

FIG. 2 is a block diagram of a simple rate multiplier and logic waveforms therefor;

FIG. 3 is a block diagram of a modification of the converter of FIG. 1 incorporating a simple error correction arrangement;

FIG. 4 is a block diagram of a more complex form of error correcting arrangement;

FIG. 9 is a block diagram of a prescaling arrangement to prevent overflow in the adders of FIG. 8;

FIG. 10 is a block diagram of a modified converter for use in a digital FDM (frequency division multiplex) system.

DESCRIPTION OF THE PREFERRED EMBODIMENTS

Figure 1:
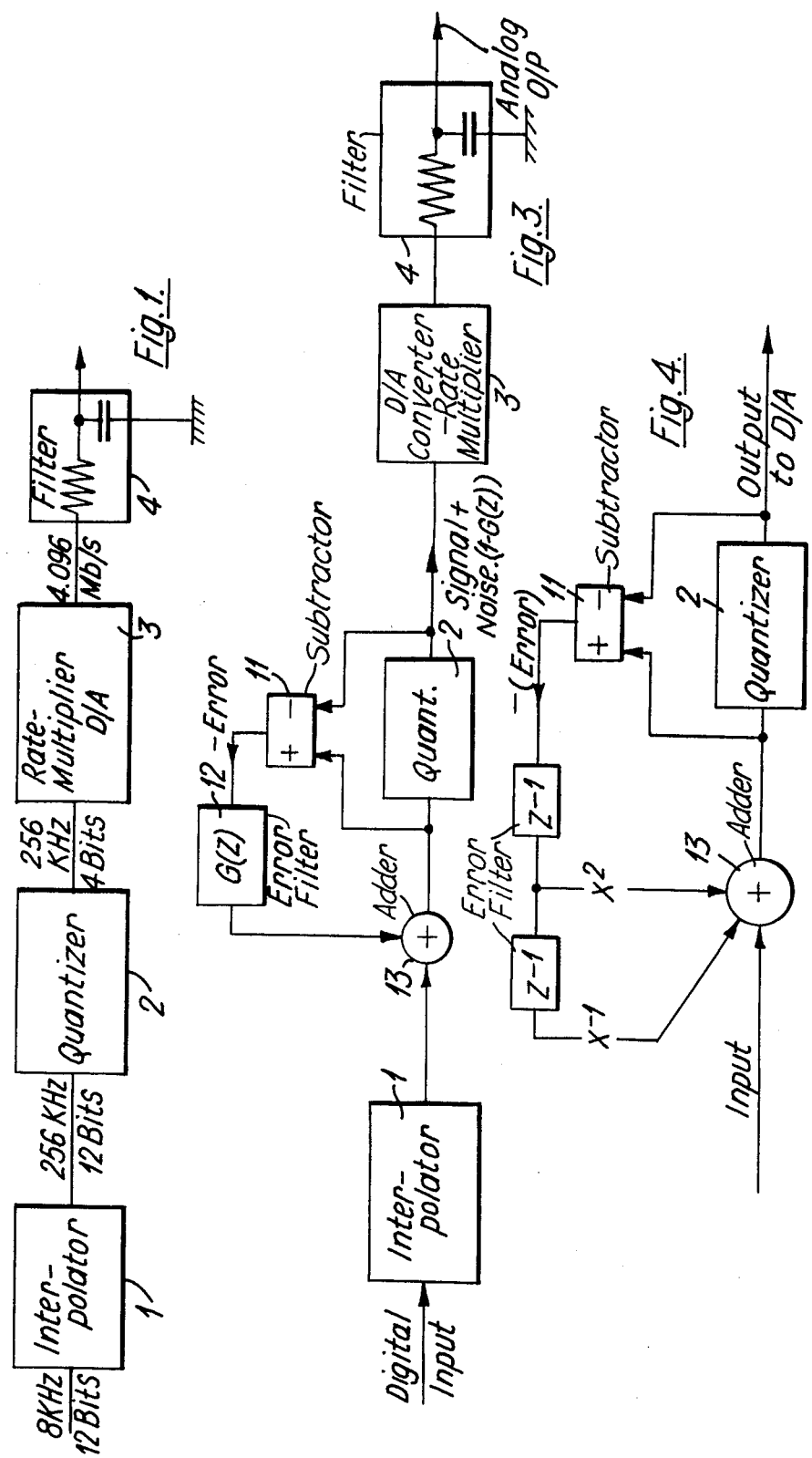
FIG. 1 is a block diagram illustrating the basic principle of a converter according to the principles of the present invention.

In the arrangement shown in FIG. 1 a pulse code modulation signal, typically 12-bit code groups at an 8kHz sampling frequency, is applied to an interpolator 1, where the sampling frequency is increased, for example to 256kHz. The signal still consists of 12-bit groups at the higher sampling frequency. The signal is then passed through a quantizer 2, which rounds the 12-bit groups to the four most significant bits, and applied to a rate multiplier 3. The pulse density modulated signal output from the rate multiplier is then passed through a low pass filter 4 to yield an analog signal.

The rate multiplier is a simple logic arrangement as shown in FIG. 2. A clock frequency $f_c$ is fed to a synchronous counter 5, the outputs of which are fed to four AND gates 6 – 9 where they are gated with the four most significant digits of the signal. The AND gate outputs are combined in an OR gate 10 yielding the pulse density output.

However, this arrangement is very crude and considerable quantizing noise will result. The noise is given by $$\text{Noise Power} = \frac{f_B \cdot 2^{-2N}}{0.75 f_s} \cdot P_s \text{Watts}$$

where
$f_B$ is the noise bandwidth
$f_s$ is the sampling frequency
N is the number of bits $P_s$ is the rms (root meansquare) power of the peak sinewave signal that can be transmitted.

For example, in a PCM system where
$f_B$ = 3.1kHz (300 - 3400Hz)
$f_s$ = 256kHz
N = 4
$P_s$ = 2mW (milliwatts) (+3dBmO crash point)
the noise would be 0.126μW (microwatts) = −39dBmO (decibel referred to zero milliwatts)

This performance would be insufficient for most purposes so suppose that an error signal is generated and fed back through a digital transfer function G(Z) as shown in FIG. 3.

The 12-bit input to the quantizer 2 has subtracted from it the 4-bit output in circuit 11, and the difference (error) is applied to an error filter 12 to generate an error signal. The error signal is then fed back to the quantizer input, with the appropriate polarity, via adder 13.

The original quantized output can be equated to noise plus a straight through transfer of the signal. The error corrected output then becomes $$V_{OUT} = V_{IN} + (1 - G(Z)) * \text{Noise}$$

where
$Z = e^{j\omega T} = \cos \omega T + j \sin \omega T$

T = Delay time

For stability G(Z) must contain at least one sample time delay and so the most elementary form is when $G(Z) = Z^{-1}$ i.e. a single delay. In this case the noise is multiplied by $1 - Z^{-1}$ which causes considerable attenuation at low frequencies at the expense of noise enhancement at higher frequencies. The attenuation is dB (decibel) is given by
$-20 \log |1 - Z^{-1}|$ $= -20 \log |1 - (\cos \phi + j \sin \phi)|$ $= -10 \log (2(1 - \cos \phi)) = -20 \log (2 \sin (\phi/2))$ where $\phi = 2\pi f/f_s$ For example the already cited attenuation at D.C. (direct current) is infinity falling to 27.6dB at 3400Hz (hertz). Although this is a worthwhile improvement it is not enough to satisfy the requirements of such systems as 30 time slot PCM.

Figure 5:
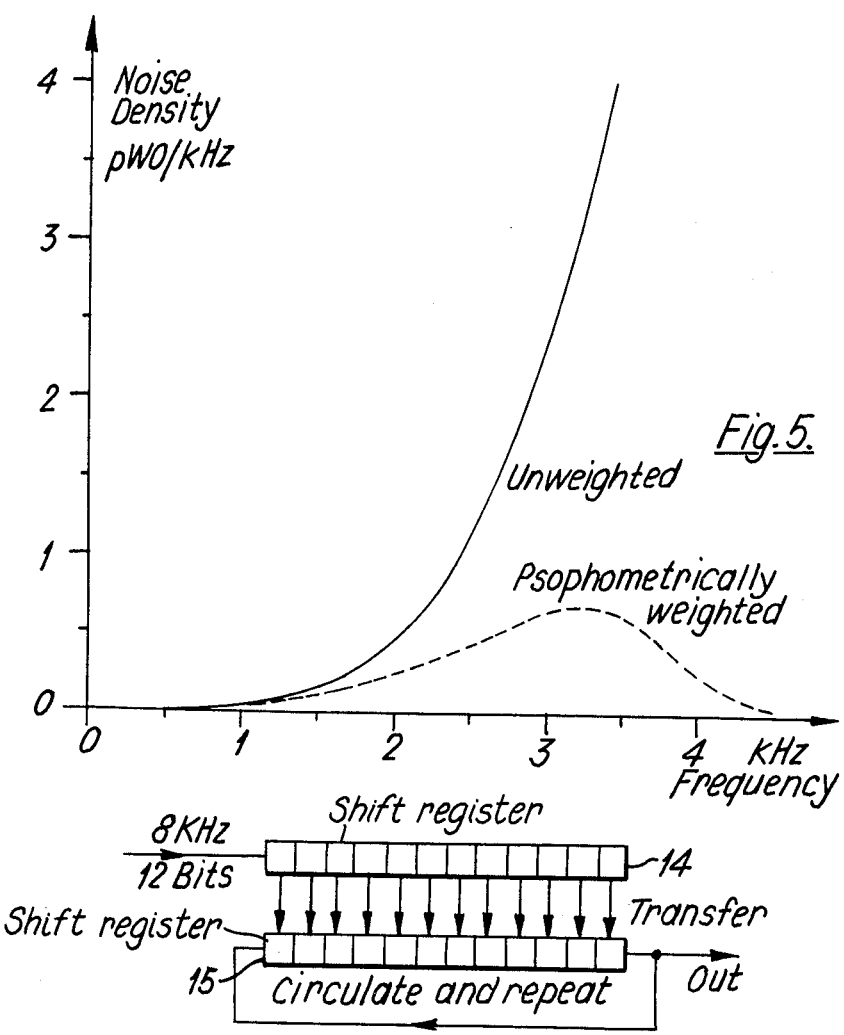
FIG. 5 illustrates graphically the noise spectrum of the digital-to-analog converter of FIG. 1 when it incorporates the error correcting arrangement of FIG. 4.

Once the principle is established it is easy to see how to extend the design for improved performance. It is generally expedient to use round numbers for the coefficients of G(Z) and to use a low order function to keep the hardware complexity down. The next step in improving the performance is to make 1-G(Z) = $(1-Z^{-1})^2$ i.e. $G(Z) = 2Z^{-1} - Z^2$ which doubles the noise attenuation over the band of interest while keeping the arithmetic operations simple. This is shown in FIG. 4. Again, for the example already cited, the noise will now rise from zero at D.C. to 3.94 pW/kHz to 3400Hz. Total noise over the band 300 to 3400Hz is 2.70pWO (picowatts with reference to zero milliwatts) or 1.25 pWOp (picowatts with reference to zero picowatts). The noise spectrum for this case is shown in FIG. 5.

It should be emphasized that the theoretical noise figure formula is approximate and assumes that the quantization errors are uncorrelated with the signal. This is not entirely true, particularly at low signal levels, but the theory can at least provide a good first estimate on which to base further work. The table below gives an estimate of the expected performance of the arrangement of FIG. 4 for various conditions.

| Sampling Frequency kHz | No. of Bits | Noise .3 - 3.4kHz pWO | dBmO |
|---|---|---|---|
| 1024 | 2 | .042 | − 103.7 |
| 512 | 3 | .337 | − 94.7 |
| 256 | 4 | 2.69 | − 85.7 |

For any given sampling frequency an extra bit will improve the signal to noise ratio by 6dB.

Figure 6:
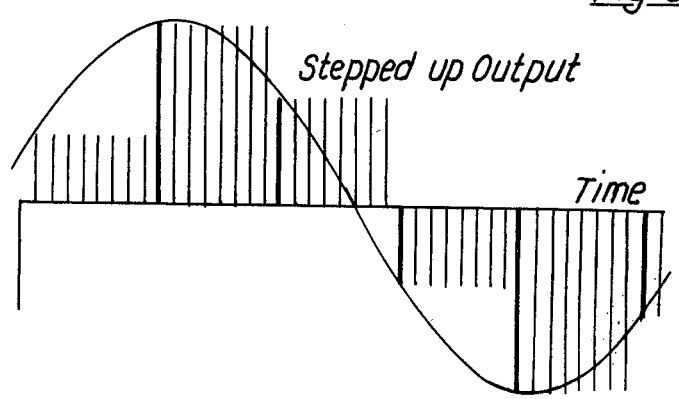
FIG. 6 is a block diagram of a simple interpolator for increasing the signal sampling rate and a curve illustrating the operation of the interpolator.

FIG. 6 shows the use of an interpolator for stepping up the sampling rate from 8kHz to 256kHz. In fact, for correct operation of the converter a complicated interpolator is not necessary. The converter will work perfectly well if the same 8kHz sample is delivered to it 32 times (i.e. at 256kHz rate) followed by the next sample 32 times and so on. This is illustrated in FIG. 6. The 12-bit serial groups are read into a shift register 14 at the 8kHz sample frequency and transferred in parallel to a second register 15 where they are read out serially at the 256kHz sample rate.

The effect, however, will be to introduce components in the output spectrum at m.8kHz ± f which will have to be suppressed by an analog low pass filter of sufficient quality, (e.g. 4th or 5th order for PCM).

Improved interpolating filters can be used to reduce the analog filtering requirements. One simple improvement is to interpolate between the given points using a straight line approximation.

Interpolating filters can be equated to an arrangement where N−1 additional zero value samples are inserted between the given ones followed by a digital filter at $N.f_s$. The simple arrangement of FIG. 6 gives an equivalent spectrum filtering of $$G(Z) = 1 + Z^{-1} + Z^{-2} + Z^{-3} Z^{-(N-1)} = (1 - Z^{-N}/1 - Z^{-1}) \text{ (Gain)}$$

which gives attenuation peaks at $f_s$ and all its harmonics together with a rising loss characteristic. At low frequencies (i.e. up to 4kHz for PCM when $f_s$ = 8kHz) the effect is very close to the normal (Sin (x)/x) aperture distortion of an ordinary digital-to-analog converter.

Figure 7:
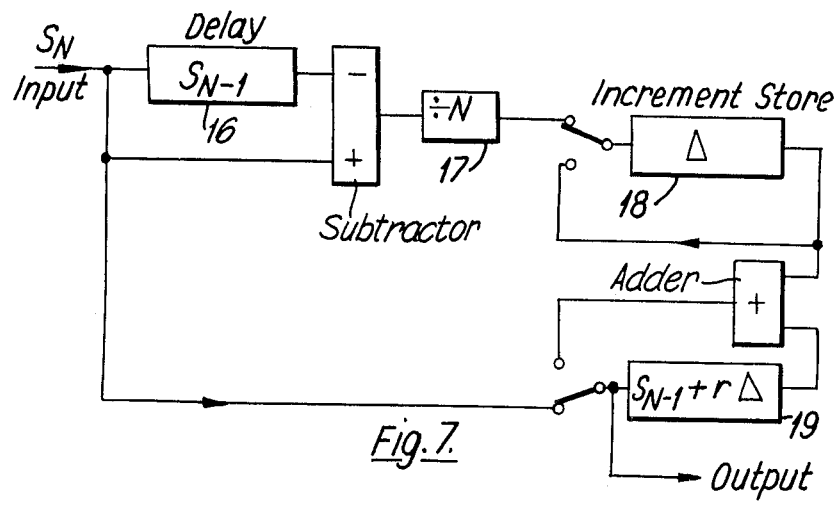
FIG. 7 is a block diagram of an alternative form of interpolator.

A straight line interpolator which inserts extra data values on a straight line drawn between the given values can be shown to give a spectrum filtering equivalent $$G(Z) = \left[ \frac{1 - Z^{-N}}{1 - Z^{-1}} \right]^2$$

which gives double the attenuation of the previous case. Such an interpolator can be made quite simply as shown in FIG. 7. The input signal $S_n$ is fed to a delay 16. The delayed signal $S_{n-1}$ is subtracted from the original signal and the difference fed to a divide-by-N circuit 17. The divider output is fed to an increment store 18 where it is circulated until replaced by a fresh input. The contents of store 18 are repeatedly added to the circulating contents of output store 19, these contents being originally the signal $S_n$. When the next sample $S_n$ arrives it replaces the previous contents of store 19 and is then incremented N times by an amount which is 1/N th of the difference between that sample and the previous sample.

More sophisticated interpolating can be achieved by first stepping up the sampling rate to an intermediate value using a recursive filter followed by a second step up to the final rate. A practical arrangement for this is outlined below.

PCM data is normally presented to the converter as 8kHz 8 bitcompanded words. For use with the type of converter described here it is necessary to first expand each 8 bit compressed word into a 12-bit linear word which can be done by a standard logical method.

Figure 8:
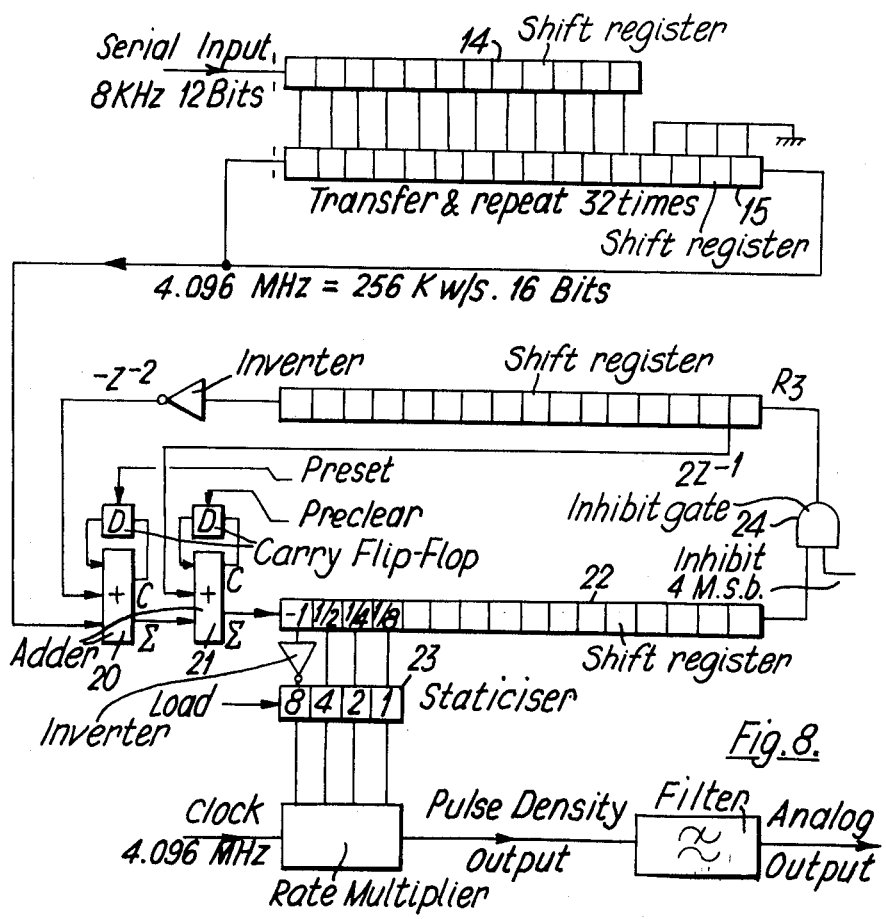
FIG. 8 is a block diagram of a practical form of digital-to-analog converter according to the principles of the present invention.

FIG. 8 shows a circuit for direct conversion of 8kHz linear words to 256kHz 4 bit words. For the sake of simplifying the clock arrangements an extra four bits are added to the 12-bit words in register 15 to make them up to 16-bit words. All the arithmetic is processed serially at 4.096kHz = 256kHz × 16 bits but to save shift register bits the clocks to the various registers could be gated with timing signals to stop shifting after the appropriate operation is complete.

It is assumed that the data is in serial 2's complement, least significant bit first format so that the arithmetic operations become very simple. Multiplication by −1 is achieved by complementing the data which gives a negligible error of one least significant bit (1 part in 16384). Multiplication by two is done with a one bit delay which will always naturally be clear at the end of each 16 bit cycle. The adders 20 and 21 each require two full adder cells with an associated carry flip flop. Any residual carry at the end of a word cycle must also be cleared.

The 16 bit words in register 22 that result from addition are truncated to 4 bits and staticised in staticiser 23 for a 4 bit rate multiplier. The error which is contained in the 12 least significant bits in register 22 is allowed to progress round the feedback loop. The 4 most significant bits are inhibited from circulating by INHIBIT gate 24.

Since the rate multiplier cannot handle negative data the most significant bit (i.e. the sign bit) should be complemented. Then the output which was from −8 to +7 is offset by 8 and becomes from 0 to +15.

It should be pointed out that expansion A or $\mu$ law to linear format can be achieved very simply by implementing the following formula. Each compressed word contains a sign bit S, 3 exponent bits E, and 4 magnitude bits M and then for $\mu$ law the output is $$O\mu = S. [(33 + 2M) .2^E − 33] − 8031 \leq O\mu \leq + 8031$$

and for A law
$$O_A = S. [(1 + X + 2M) .2^E]$$

where X = 0 for E = 0 X = 32 for E $\neq$ 0 Note that the A law output has been scaled by a factor of two to be of the same magnitude approximately as the $\mu$ law i.e. $- 8064 \leq O_A \leq + 8064$ To implement the formula it is simply necessary to add a constant to the magnitude, shift E places and subtract a constant.

It should also be noted that it is possible for the adder to overflow for large positive input signals. In the case of FIG. 8 where the input number range is from +1 to −1 the adder may overflow for signals exceeding −⅞ or +¾. There are two possible countermeasures for this. The first is to preattenuate the signal to that overflow cannot occur. The second method is to add an extra most significant bit to the data and incorporate overflow protection in the adder.

In the case under consideration the worst cases before overflow occurs are
(1) positive input, register $R_3$ contains maximum error 00001111 1111 1111, register 2Z zero. then N + 0001111....$\leq$ 011111111. . . . therefore N $\leq$ 011000... i.e. $\leq$ + ¾
(2) negative input, register $R_3$ zero, register 2Z contains 00001111 1111 1111 then N − 00001111....$\geq$ 1000 0000... therefore N$\geq$ 100001111.... $\geq$ −⅞ − one L.S.B.

Therefore to prevent overflow and including the fact that signals should be symmetrical about zero then input numbers must be restricted to the range − ¾ $\leq$ N $\leq$ + ¾. The simplest means of effecting this is to premultiply the data by scaling a factor of ¾. This is easily done by adding together half and quarter of the input obtained as shown in FIG. 9.

As a further example the audio digital-to-analog converter in another digital system might be required to convert 18 bit samples at 16kHz to audio with a minimum increase in noise. With standard techniques it is necessary to preround the signal to 13 or 14 bits since an 18 bit converter is not practical. With the converter described here this is avoided by retaining the full 18 bits thus giving improved performance at 4MHz logic clock rates compared with the previous best of a scaled rate multiplier needing 8MHz clocking.

The system clock rate is 4.032MHz = 16kHz × 14 channels × 18 bits. It is feasible to step up the sampling rate 14 times to 224kHz retaining serial arithmetic since 224kHz × 18 bits = 4.032MHz. This is done in two steps, first to 32kHz with a non recursive filter, secondly to 224kHz with a shift register store which repeats each 32kHz sample 7 times. FIG. 10 shows the overall block diagram.

Figure 11:
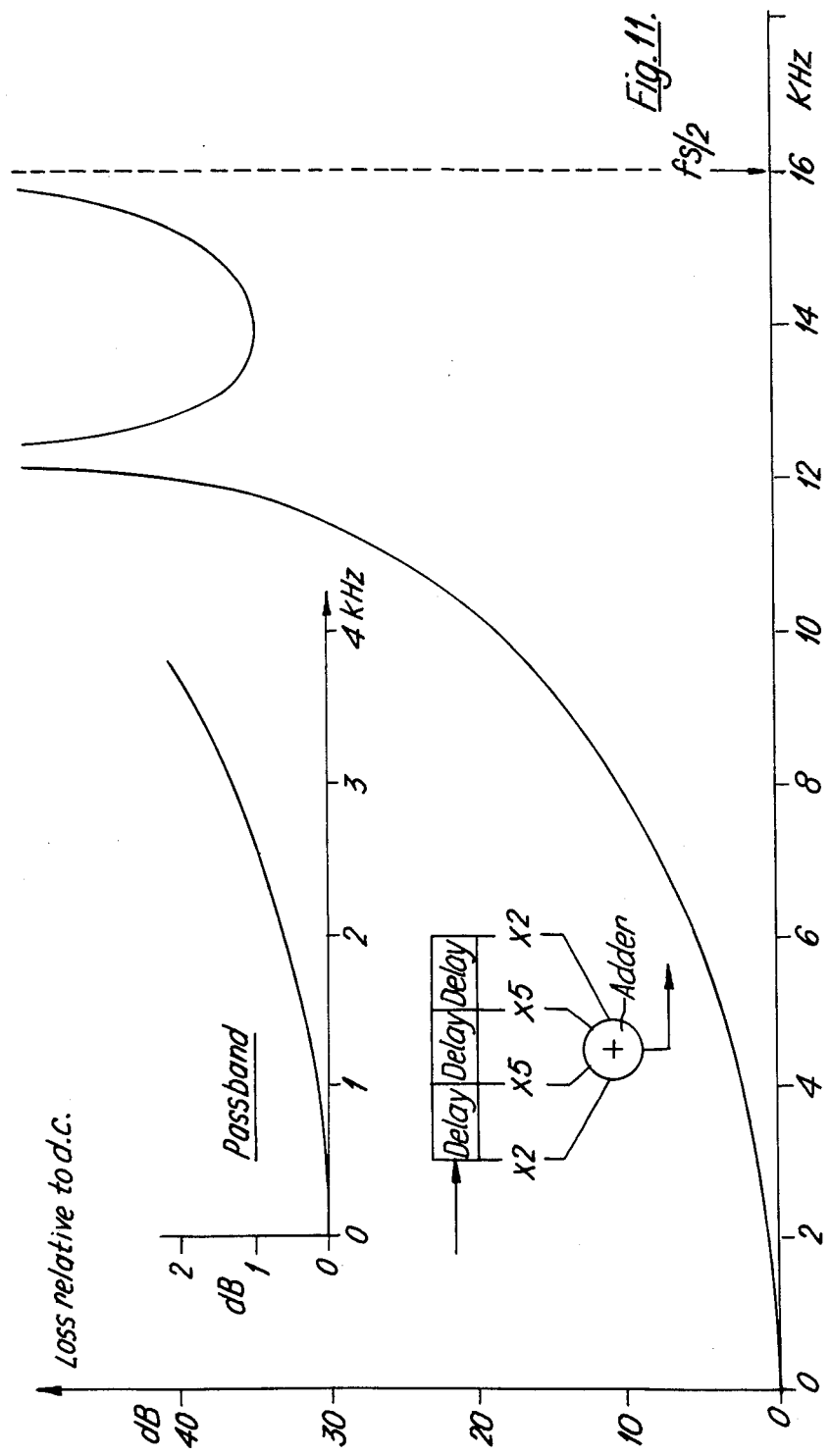
FIG. 11 is a block diagram of a non-recursive filter suitable for use in the converter of FIG. 10 and curves illustrating the operation of the non-recursive filter.

The 16 − 32kHz non-recursive filter and its response are shown in FIG. 11. A three stage delay is used, and the input signal and delayed signals from each stage are each multiplied by a given factor. All the signals are then summed in the adder.

While I have described above the principles of my invention in connection with specific apparatus it is to be clearly understood that this description is made only by way of example and not as a limitation to the scope of my invention as set forth in the objects threof and in the accompanying claims.

I claim:
1. A digital-to-analog converter for a pulse code modulated (PCM) signal having a plurality of code groups and a given sampling rate comprising:
   interpolating means having said PCM signal coupled thereto for increasing said given sampling rate of said PCM signal;
   means for selecting a predetermined number of the most significant bits of each of said code groups of said increased sampling rate PCM signal;
   means for decoding said predetermined number of most significant bits at a rate corresponding to said increased sampling rate to derive a pulse stream having a mean density which is proportional to an analog signal represented by said plurality of code groups;
   means for selecting at least some of the least significant bits of each code of said code groups of said increased sampling rate PCM signal for deriving an error signal; and feedback means for digitally adding said error signal to subsequently digitally sampled code groups.

2. A digital-to-analog converter according to claim 1 wherein said feedback means includes digital filter means for reducing the noise in said error signal.

3. A digital-to-analog converter according to claim 2 wherein said PCM signal is a linear digital signal.

4. A digital-to-analog converter for a pulse code modulated (PCM) signal having a plurality of code groups and a given sampling rate comprising:
a source of said PCM signal;
first means coupled to the output of said source for increasing said given sampling rate of said PCM signal;
second means coupled to the output of said first means for selecting a predetermined number of the most significant bits of each of said code groups of said increased sampling rate PCM signal; and
third means coupled to the output of said second means for converting said most significant bits into a pulse stream having a mean density which is proportional to an analog signal represented by said plurality of code groups wherein
said first means includes fourth means coupled to the output of said source for interpolating additional pulse code groups in the intervals between said plurality of code groups; and
wherein said fourth means includes fifth means coupled to the output of said source for storing each of said plurality of code groups until the next of said plurality of code groups is received, said fifth means also being coupled to the input and output of said second means to generate an error signal when said error is determined; and
wherein said fourth means is coupled to at least the output of said second means to determine any error resulting from said selection of said predetermined number of most significant bits;
sixth means coupled to said fifth means for circulating each of said stored code groups two or more times while stored; said
sixth means also being coupled to the output of said fifth means and to the input of said second means to couple said error signal to the input of said second means to reduce said error.

5. A converter according to claim 4, wherein said first means includes seventh means coupled to the output of said source for storing each of said plurality of code groups until the next of said plurality of code groups is received, and
eighth means coupled to said seventh means for repeatedly circulating each of said stored code groups a predetermined number of times while stored.

6. A converter according to claim 4, wherein said fourth means includes
fifth means coupled to the output of said second means to delay said selected predetermined number of most significant bits at least one time interval equal to one sampling period of said increased given sampling rate,
sixth means coupled to the output of said fifth means to complement said delayed selected predetermined number of most significant bits, and
seventh means coupled to the output of said fifth means, the output of said sixth means and the input of said second means to perform an arithmetical addition of said delayed and complemented selected predetermined number of most significants bits to the succeeding one of said plurality of code groups being applied to the input of said second means.

7. A converter according to claim 6, further including eighth means coupled to said fifth means for weighting
at least one group of said selected predetermined number of most significant bits which has been subjected to a delay of more than one of said time intervals, eighth means including ninth means for multiplying said one group by an integer.

8. A converter according to claim 7, wherein said third means includes
a rate multiplier employed to the output of said seventh means.

9. A converter according to claim 8, wherein said third means further includes
a low pass filter coupled to the output of said rate multiplier.

10. A converter according to claim 6, wherein said third means includes a rate multiplier coupled to the output of said seventh means.

11. A converter according to claim 10, wherein said third means further includes
a low pass filter coupled to the output of said rate multiplier.

* * * * *